United States Patent
Wu et al.

(10) Patent No.: US 7,071,045 B2
(45) Date of Patent: Jul. 4, 2006

(54) PROCESS OF MANUFACTURING THIN FILM TRANSISTOR

(75) Inventors: Ying-Ming Wu, Taoyuan (TW); Yi-Tsai Hsu, Taoyuan (TW); Chin-Tzu Kao, Changhua (TW); Yung-Hsin Wu, Taoyuan (TW); Jui-chung Chang, Taichung (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 81 days.

(21) Appl. No.: 10/839,170

(22) Filed: May 6, 2004

(65) Prior Publication Data

US 2005/0250270 A1    Nov. 10, 2005

(51) Int. Cl.
*H01L 21/336*    (2006.01)
(52) U.S. Cl. ...................................... 438/197; 257/288
(58) Field of Classification Search .................. None
See application file for complete search history.

(56) References Cited

U.S. PATENT DOCUMENTS

| | | | |
|---|---|---|---|
| 6,555,409 B1 * | 4/2003 | Kim et al. ............... | 438/34 |
| 6,599,786 B1 * | 7/2003 | Ahn et al. ............... | 438/155 |
| 6,674,495 B1 * | 1/2004 | Hong et al. ............. | 349/43 |
| 6,696,324 B1 * | 2/2004 | Hong et al. ............. | 438/149 |
| 6,734,049 B1 * | 5/2004 | Yoo et al. ............... | 438/151 |
| 6,862,070 B1 * | 3/2005 | Sugimoto et al. ........ | 349/149 |
| 6,870,187 B1 * | 3/2005 | Chung .................... | 257/59 |
| 6,897,099 B1 * | 5/2005 | Yoo et al. ............... | 438/149 |
| 6,924,179 B1 * | 8/2005 | Oh et al. ................. | 438/157 |
| 6,943,367 B1 * | 9/2005 | Kim et al. ............... | 257/25 |
| 2005/0167669 A1 * | 8/2005 | Kim et al. ............... | 257/72 |

\* cited by examiner

*Primary Examiner*—Thao P. Le
(74) *Attorney, Agent, or Firm*—Rabin & Berdo, P.C.

(57) ABSTRACT

A process of producing a thin film transistor includes forming a gate line on a substrate by first exposure and development processes. A source electrode, a drain electrode and a semiconductor channel are formed by second exposure and development processes. An island-shaped transistor is formed by third exposure and development processes. A protection layer with a contact hole therein is formed by fourth exposure and development processes. A pixel electrode is formed by fifth exposure and development processes to connect to the contact hole.

12 Claims, 6 Drawing Sheets

PROCESS OF MANUFACTURING THIN FILM TRANSISTOR

BACKGROUND OF THE INVENTION

1. Field of Invention

The present invention relates to a thin film transistor, and more particularly to a process of manufacturing a thin film transistor.

2. Related Art

A liquid crystal display is constructed from a pair of substrates assembled opposite to each other to form a gap there between. A liquid crystal layer is sandwiched between the substrates. Each substrate has one electrode facing another electrode of the opposite substrate. When a voltage is applied on the two electrodes, an electric field is generated between the two electrodes. By changing the intensity and direction of this electric field, the orientation of the liquid crystal molecules in the liquid crystal layer is modified. The transmission of light through the liquid crystal layer thereby is controlled via the variation of the orientation of the liquid crystal molecules. Display patterns are thereby obtained on the liquid crystal display device.

FIG. 1 is a partially exploded view of a conventional liquid crystal display. The conventional liquid crystal display includes an upper substrate 5 and a lower substrate, 22 facing each other. A liquid crystal layer 15 is sandwiched between the substrates 5, 22. The upper substrate 5 includes a black matrix line 6, a color filter 7, and a common electrode 9. The black matrix line 6 forms a plurality of openings distributed in array. Each of the openings has a size fitting the color filter 7. The color filter 7 may be a red, green or blue color filter. The common electrode 9 is transparent and placed on the color filter 7. A gate line 12 and a data line 34 are formed on the lower substrate 22. The gate line 12 intersects with the data line to define a pixel region P. A thin film transistor T is an inverting element consisting of a gate electrode, a source electrode and a drain electrode. A plurality of thin film transistors T is respectively arranged in array in areas defined by the gate line 12 and the data line 34 (i.e., regions P). A pixel electrode 56 and a thin film transistor T in one P region connect to each other. The pixel electrode 56 is made of a transparent conductive material with good light transmission, such as indium-tin-oxide (ITO). Each pixel electrode 56 aligns with a corresponding color filter. The lower substrate 22 includes a plurality of thin film transistors T and a plurality of pixel electrodes 56 in array, to form an array substrate of the liquid crystal display.

When a scanning pulse scans the gate electrode of the thin film transistor via the gate line 12, a data signal is generated and sent to the source electrode of the thin film transistor via the data line 34.

The liquid crystal display is driven via the optical properties of the liquid crystal material. The liquid crystal material is a dielectric anisotropic material having controllable polarization properties. When an adequate voltage is applied on the liquid crystal layer, the liquid crystal molecules orientate to form a dipole in accordance with the direction of the electric field. The orientation of the liquid crystal molecules determines the transmission of light there through. Images on the liquid crystal display are typically generated by controlling the light transmission of the liquid crystal layer.

FIG. 2A to FIG. 2F are cross-sectional views illustrating a conventional process of producing a thin film transistor using five photo masks.

Referring to FIG. 2A, a first metal layer is formed on a substrate 100 by physical vapor deposition. The metal layer is made of aluminum, chromium or molybdenum. The substrate 100 is made of an insulating non-alkaline glass. Then, a first photo resist (not shown) is formed on the first metal layer. After first exposure and development processes are performed, using a first photo mask, dry or wet etching is performed to remove portions of the first metal layer and form a gate line 101 on the substrate 100. The first photo resist (not shown) on the gate line 101 then is removed.

Referring to FIG. 2B, a gate electrode insulator 102, a semiconductor layer 103, an ohmic contact layer 104 and a second photo resist (not shown) are subsequently formed on the gate line 101 by plasma enhanced chemical vapor deposition. After second exposure and development processes are performed using a second photo mask, a dry etching process is performed to remove portions of the semiconductor layer 103 and the ohmic contact layer 104 and form a predetermined island-shaped transistor region. Then, the second photo resist (not shown) is removed. The ohmic contact layer 104 is, for example, an N type heavily doped silicon layer. The gate electrode insulator 102 is, for example, a silicon nitride or silicon dioxide.

Referring to FIG. 2C, a second metal layer 105 is formed on the island-shaped transistor region of the substrate by physical vapor deposition. A third photo resist (not shown) is formed on the second metal layer 105. After the third exposure and development processes are performed using a third photo mask, dry or wet etching is performed to form a source electrode 105a and a drain electrode 105b on the island-shaped transistor region. The source electrode and the drain electrode are spaced apart from each other by a gap through which the ohmic contact layer 104 is exposed. The second metal layer 105 is made of aluminum, chromium or molybdenum.

Referring to FIG. 2D, using the third photo resist (not shown) on the source electrode 105a and the drain electrode 105b as a mask, a dry etching process is performed to remove a portion of the ohmic contact layer not covered by the third photo resist (not shown) on the source electrode 105a and the drain electrode 105b. It thereby exposes the semiconductor layer 103 so as to form a semiconductor channel 106 between the source electrode 105a and the drain electrode 105b. This process is called a back channel etching (BCE) process. Then the third photo resist (not shown) is removed.

Referring to FIG. 2E, a protection layer 107 is formed on the island-shaped transistor region of the substrate 100 by plasma enhanced chemical vapor deposition. Then a fourth photo resist (not shown) is formed on the protection layer 107. After the fourth exposure and development processes are performed, using a fourth photo mask, a dry etching process is performed to define a contact hole 108 in the protection layer 107 over the drain electrode 105b. Finally, the fourth photo resist (not shown) is removed. The protection layer 107 is made of, for example, silicon nitride or silicon dioxide.

Referring to FIG. 2F, a pixel electrode 109 is formed on the protection layer 107 by physical vapor deposition. A fifth photo resist (not shown) is formed on the pixel electrode 109. After the fifth exposure and development processes are performed, using a fifth photo mask, a wet etching process is performed to pattern the pixel electrode 109 so that the contact hole 108 connects to the drain electrode 105b. Finally, the fifth photo resist (not shown) is removed. The pixel electrode 109 is made of, for example, ITO.

FIG. 3 is a top view of a conventional thin film transistor. The process of the prior art has some disadvantages. When the semiconductor layer 103 is etched, the photo resist on the semiconductor shrinks under etching of the plasma, which exposes the semiconductor 103a near the island-shaped transistor region. The exposed portion of the semiconductor layer 103a may be oxidized into silicon dioxide that prevents the ohmic contact layer from being etched off. Therefore, a portion of the ohmic contact layer remains close to the channel, resulting in current leakage when the thin film transistor is turned off. Current leakage causes defects such as cross talk, flicker and spots.

SUMMARY OF THE INVENTION

It is therefore an object of the invention to provide a process of producing a thin film transistor that can overcome the problems of the prior art.

It is another object of the invention to provide a process of producing a thin film transistor in which no cross talk, flicker and spot defects are caused due to current leakage when the thin film transistor is turned off.

Furthermore, it is another object of the invention to provide a process of producing a thin film transistor in which the yield of the liquid crystal display is increased without increasing the number of photo masks, resulting in a reduced production cost.

In order to achieve the above and other objectives, a process of producing a thin film transistor using five photo masks includes: forming a first metal layer on a substrate; forming a insulator layer on the first metal layer; sequentially depositing a semiconductor layer, a ohmic contact layer and a second metal layer on the first metal layer; patterning the second metal layer, the ohmic contact layer and the semiconductor layer to form a source electrode, a drain electrode, and a channel being defined between the source electrode and the drain electrode, respectively; patterning said semiconductor layer to form an island-shaped region therein; and forming a pixel electrode in electrical connect with the drain electrode via the contact hole.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below illustration only, and is thus not limitative of the present invention, and wherein.

DETAILED DESCRIPTION OF THE INVENTION

FIG. 4A through FIG. 4F illustrate a process of producing a thin film transistor according to an embodiment of the invention.

Figure 1:
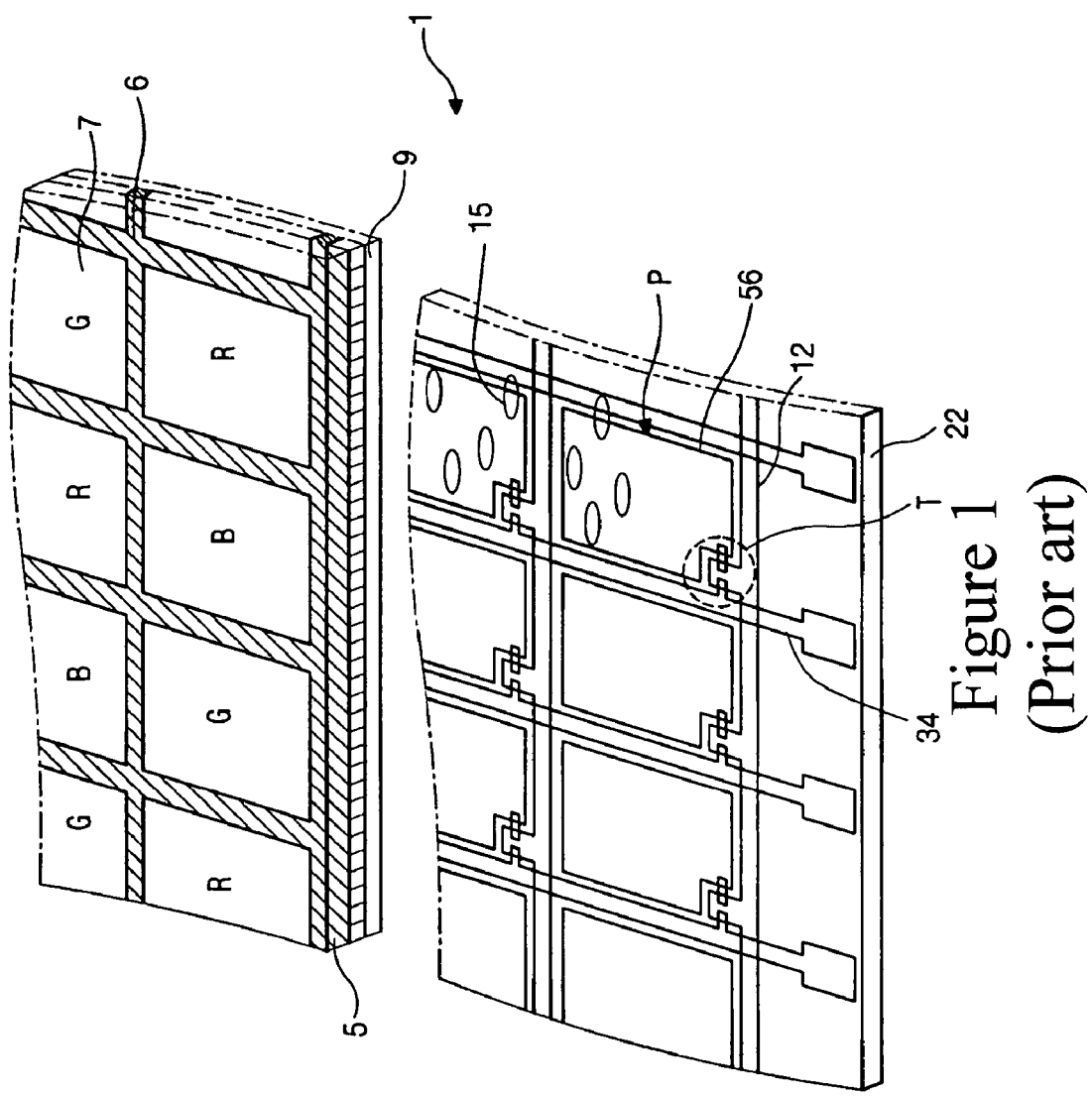
FIG. 1 is a partial exploded view of a conventional liquid crystal display.
Figure 2A:
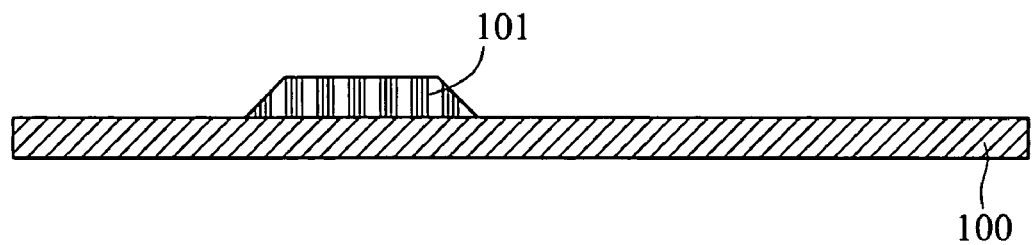
FIG. 2A through FIG. 2F are cross-sectional views illustrating the production of a conventional thin film transistor using five photo masks.
Figure 2B:
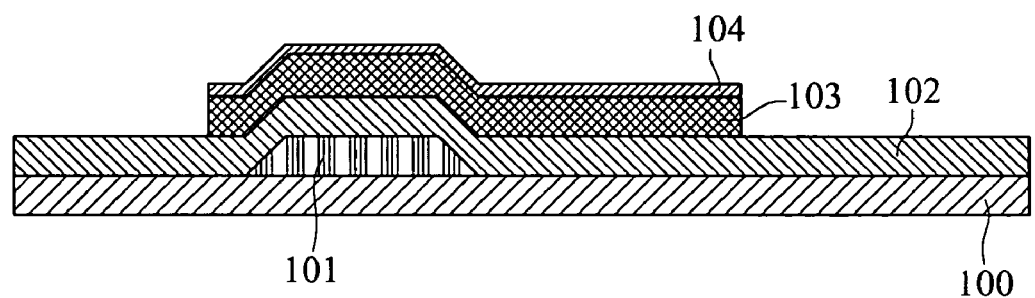
Figure 2C:
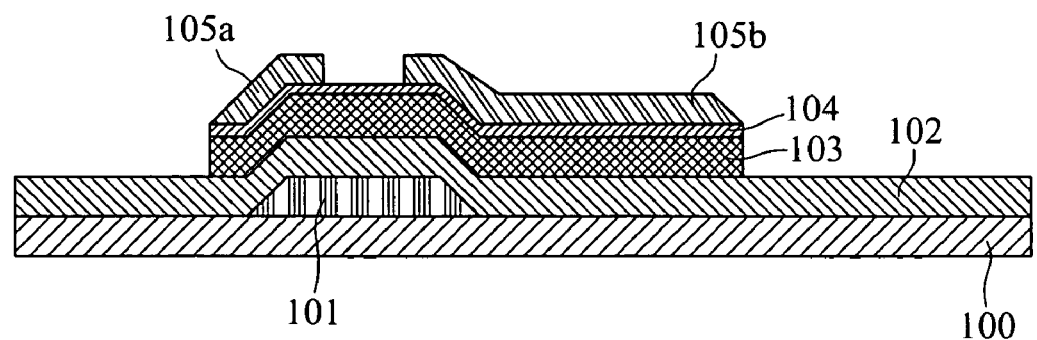
Figure 2D:
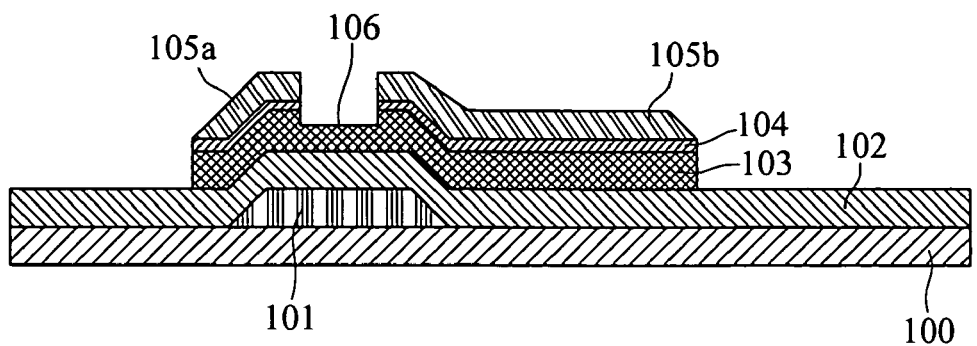
Figure 2E:
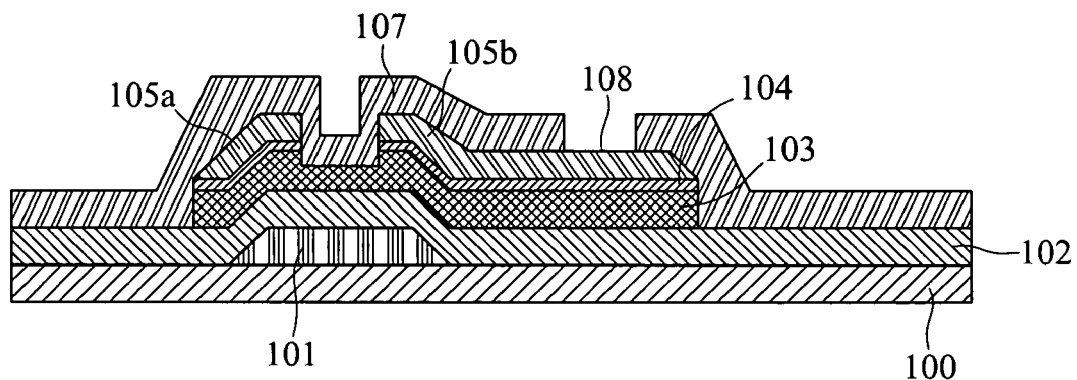
Figure 2F:
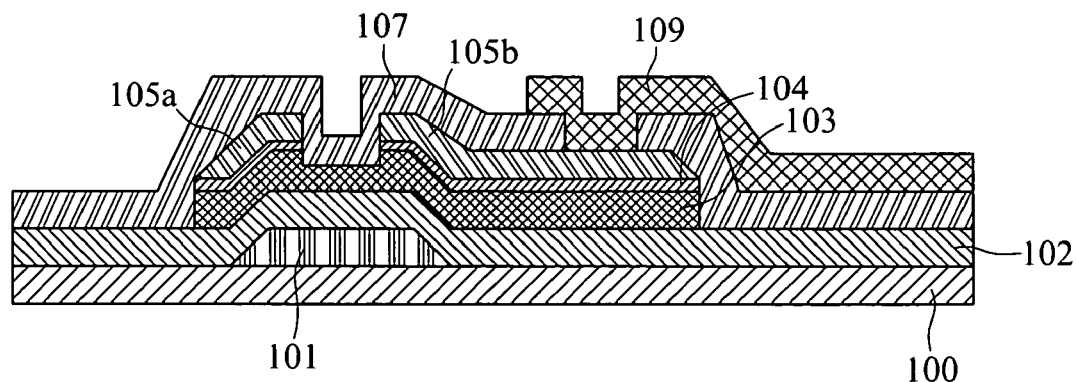
Figure 3:
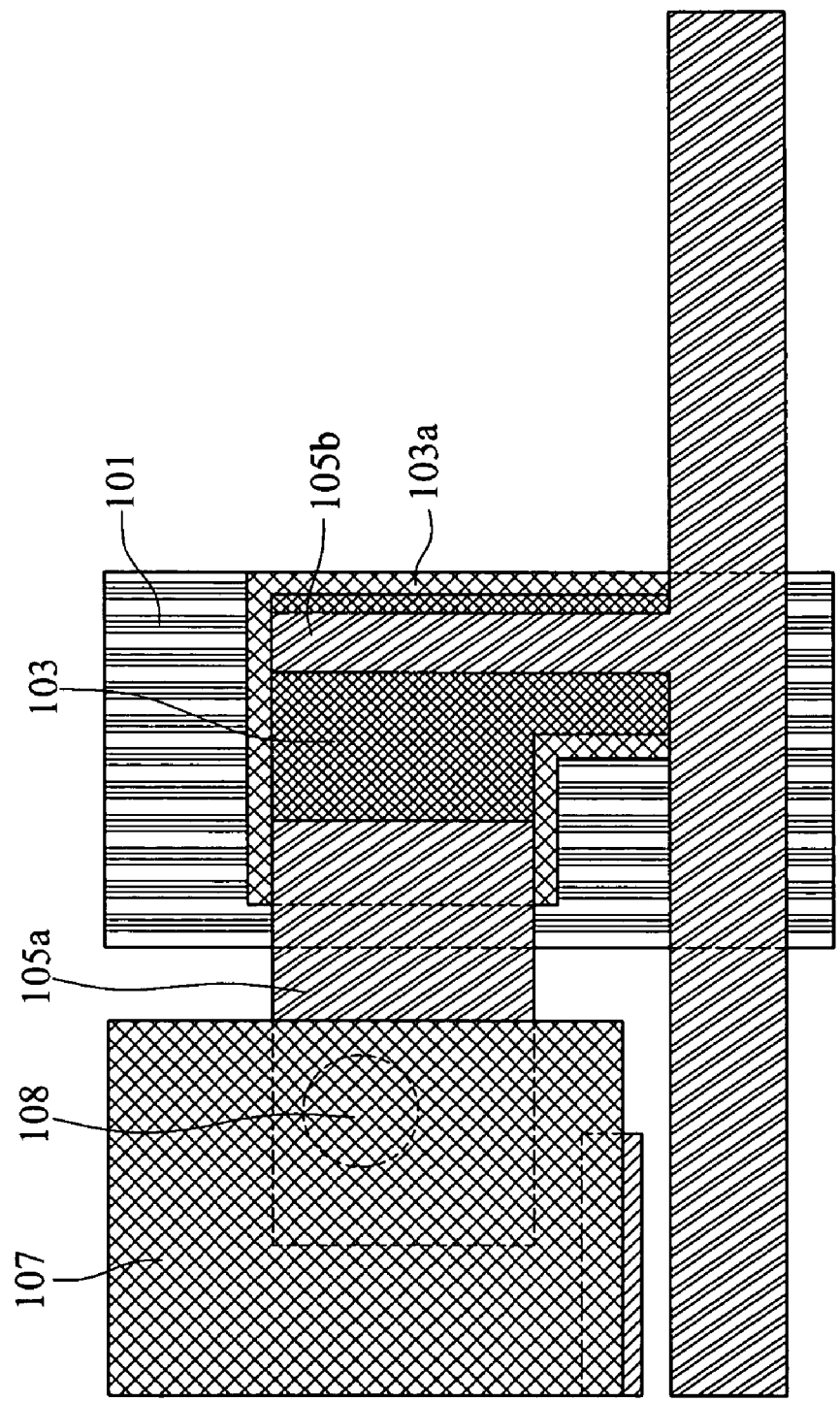
FIG. 3 is a top view of a conventional thin film transistor.
Figure 4A:
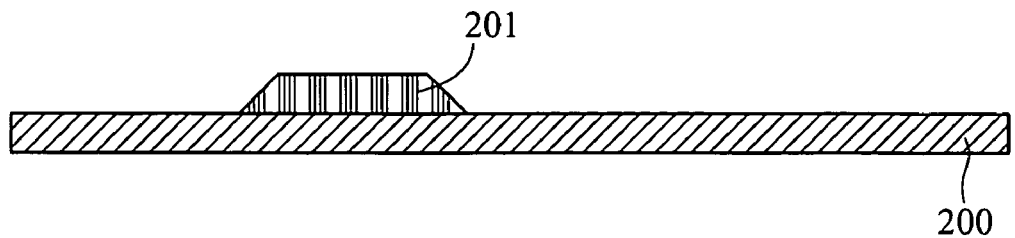
FIG. 4A through FIG. 4F illustrate a process of producing a thin film transistor using five photo masks according to an embodiment of the invention.

Referring to FIG. 4A, a first metal layer is formed by physical vapor deposition and then a first photo resist (not shown) is formed on the first metal layer. After first exposure and development processes are performed using the first photo mask, dry etching or wet etching is performed to remove unnecessary portions of the first metal layer and form a gate line 201 on a substrate 200. Then, the first photo resist (not shown) on the gate line 201 is removed.

Figure 4B:
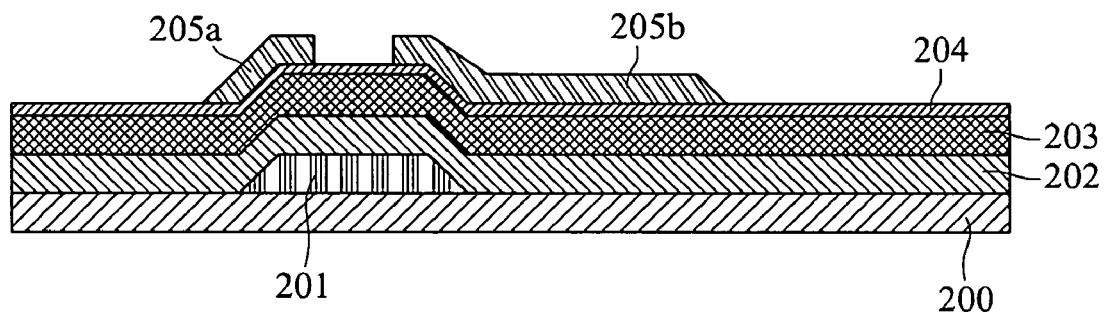

Referring to FIG. 4B, a gate electrode insulator layer 202, a semiconductor layer 203 and an ohmic contact layer 204 are subsequently formed on the gate line 201 by plasma enhanced chemical vapor deposition. A second metal layer is formed on the gate line 201 by physical vapor deposition. A second photo resist (not shown) is formed on the second metal layer. After a second exposure and development process is performed using a second photo mask, dry etching or wet etching is performed again to remove unnecessary portions of the second metal layer and form a source electrode 205a and a drain electrode 205b on the ohmic contact layer 204. The source electrode 205a is spaced apart from the drain electrode 205b by a gap through which a portion of the ohmic contact layer is exposed. The ohmic contact layer 204 is an N type heavily doped silicon layer. The semiconductor layer is formed of, for example, amorphous silicon. The gate electrode insulator 202 is a silicon nitride or silicon dioxide. The second metal layer is made of aluminum, chromium or molybdenum.

Figure 4C:
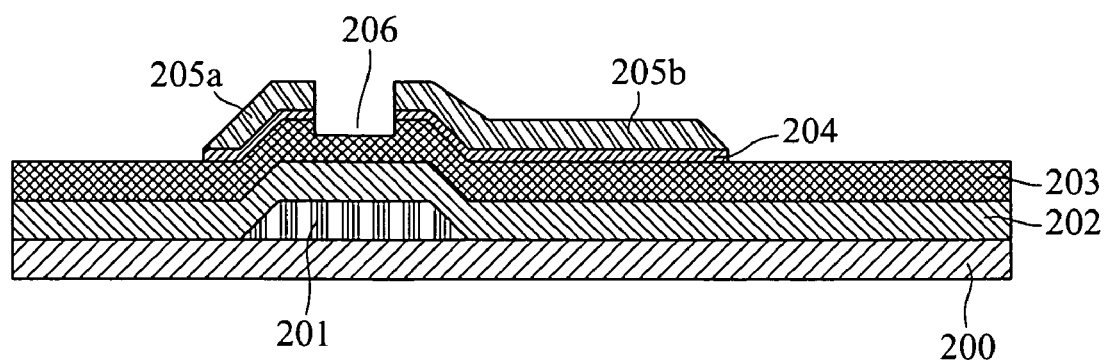

Referring to FIG. 4C, using the exposed second photo resist (not shown) on the source electrode 205a and the drain electrode 205b as a mask, a portion of the ohmic contact layer 204, not covered by the source electrode 205a and the drain electrode 205b, is removed by dry etching to form a semiconductor channel 206. This process is called a 'back channel etching (BCE) process'. Finally, the second photo resist (not shown) is removed.

Figure 4D:
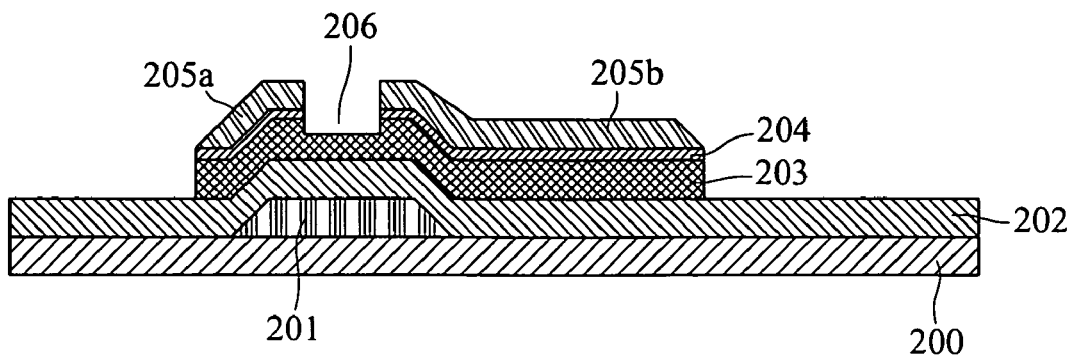

Referring to FIG. 4D, a third photo resist (not shown) is formed on the substrate 200 including the semiconductor channel 206 and an island-shaped semiconductor region. After the third exposure and development processes are performed, using the third photo mask, dry etching is performed to form an island-shaped transistor region. After exposure, the third photo resist (not shown) is removed.

Figure 4E:
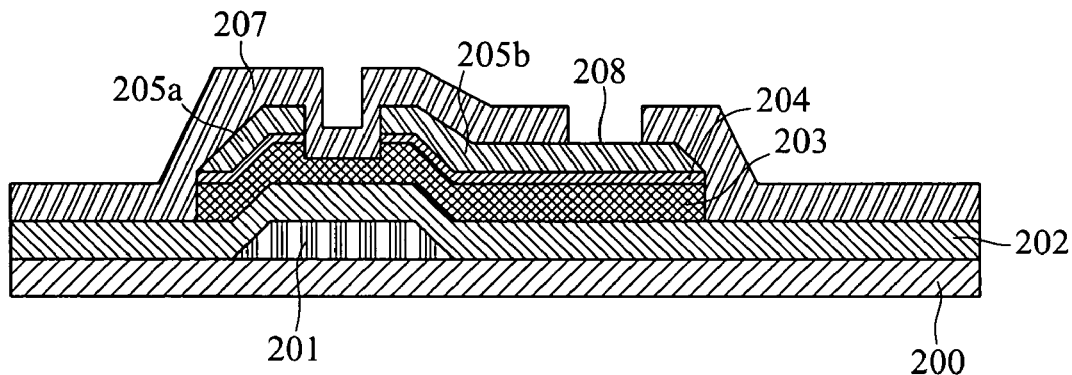

Referring to FIG. 4E, a protection layer 207 is formed by plasma enhanced chemical vapor deposition. A fourth photo resist (not shown) is formed on the protection layer 207. After the fourth exposure and development processes are performed using the fourth photo mask, a dry etching process is performed to define a contact hole 208 in the protection layer 207. Finally, the fourth photo resist (not shown) is removed. The protection layer 207 is made of silicon nitride or silicon dioxide.

Figure 4F:
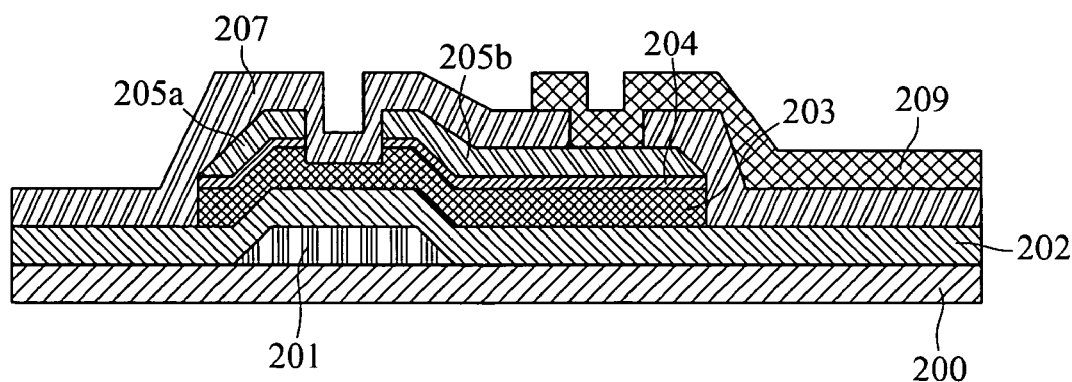

Referring to FIG. 4F, a pixel electrode 209 is formed on the protection layer 207 by physical vapor deposition. A fifth photo resist (not shown) is formed on the pixel electrode 209. After the fifth exposure and development processes are performed, using the fifth photo mask, a wet etching process is performed to form the pixel electrode 209 in electrical connect with the drain electrode 205b via the contact hole 208. Finally, the fifth photo resist (not shown) is removed. The pixel electrode 209 is made of, for example, transparent indium-tin oxide (ITO).

Knowing the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process of producing a thin film transistor, comprising:

sequentially forming a first metal layer and a first photoresist on a substrate;

patterning the first photoresist by exposure and development processes using a first photomask, and forming a gate line on the substrate by etching, and removing the first photoresist after exposure;

sequentially forming an insulator layer, a semiconductor layer, an ohmic contact layer, a second metal layer and a second photoresist layer on a gate line;

patterning the second photoresist by exposure and development processes using a second photoresist, and forming a source and a drain on the ohmic contact layer after etching to form a semiconductor channel between the source and the drain, and removing the second photoresist after exposure;

forming a third photoresist layer on the substrate, wherein the substrate includes the source, the drain, the semiconductor channel and the semiconductor layer;

patterning the third photoresist layer by exposure and development processes using a third photomask, and forming an island-shaped transistor region after etching and removing the third photoresist;

sequentially forming a protection layer and a fourth photoresist layer on the substrate with the island-shaped transistor region therein;

patterning the fourth photoresist layer by exposure and development processes using a fourth photomask, and defining a contact hole in the protection layer by etching, and removing the fourth photoresist layer;

sequentially forming a pixel electrode and a fifth photoresist layer on the protection layer; and patterning a fifth photoresist by exposure and development processes using a fifth photomask, and forming a pixel electrode by etching that connects to the drain via the contact hole, and removing the fifth photoresist layer.

2. The process of claim 1, wherein the first metal layer is made of a material selected from the group consisting of aluminum, chromium and molybdenum.

3. The process of claim 1, wherein the second metal layer is made of a material selected from the group consisting of aluminum, chromium and molybdenum.

4. The process of claim 1, wherein the protection layer is made of silicon nitride or silicon dioxide.

5. The process of claim 1, wherein the pixel electrode is made of transparent indium-tin-oxide (ITO).

6. The process of claim 1, wherein the channel is formed by back channel etching (BCE).

7. The process of claim 1, wherein the first metal layer is formed on the substrate by dry or wet etching.

8. The process of claim 1, wherein the channel is formed by dry etching the ohmic contact layer through the semiconductor layer.

9. The process of claim 1. wherein the contact hole of the protection layer is formed by dry etching, the contact hole being exposed through the drain electrode.

10. The process of claim 1, wherein the pixel electrode is formed by wet etching.

11. The process of claim 1, wherein the semiconductor layer is made of amorphous silicon.

12. The process of claim 1, wherein the ohmic contact layer is an N type heavily doped silicon layer.

* * * * *